United States Patent
Blue et al.

(10) Patent No.: US 10,436,978 B2
(45) Date of Patent: Oct. 8, 2019

(54) INTERNAL CLADDING IN SAPPHIRE OPTICAL DEVICE AND METHOD OF MAKING SAME

(71) Applicant: OHIO STATE INNOVATION FOUNDATION, Columbus, OH (US)

(72) Inventors: Thomas Elder Blue, Columbus, OH (US); Brandon Augustus Wilson, Columbus, OH (US)

(73) Assignee: Ohio State Innovation Foundation, Columbus, OH (US)

( * ) Notice: Subject to any disclaimer, the term of this patent is extended or adjusted under 35 U.S.C. 154(b) by 0 days.

(21) Appl. No.: 15/928,411

(22) Filed: Mar. 22, 2018

(65) Prior Publication Data
US 2018/0275339 A1 Sep. 27, 2018

Related U.S. Application Data

(60) Provisional application No. 62/475,312, filed on Mar. 23, 2017.

(51) Int. Cl.
*G02B 6/02* (2006.01)
*C30B 29/20* (2006.01)
(Continued)

(52) U.S. Cl.
CPC .......... *G02B 6/02076* (2013.01); *C30B 29/20* (2013.01); *C30B 29/60* (2013.01); *C30B 33/04* (2013.01); *G01B 11/161* (2013.01); *G01D 5/3538* (2013.01); *G01K 11/3206* (2013.01); *G01L 11/025* (2013.01); *G02B 6/0219* (2013.01); *G02B 6/0288* (2013.01);
(Continued)

(58) Field of Classification Search
CPC ................ G02B 6/02076; C30B 33/04; G01D 5/35316; G01L 11/025; G01K 11/3206
See application file for complete search history.

(56) References Cited

U.S. PATENT DOCUMENTS

| | | | | | |
|---|---|---|---|---|---|
| 5,381,229 A | * | 1/1995 | Murphy | ................ | G01D 5/268 250/227.19 |
| 5,579,427 A | * | 11/1996 | Rusanov | ................ | C30B 13/00 385/124 |

(Continued)

OTHER PUBLICATIONS

William Spratt, et al. "Optical mode confinement and selection in single-crystal sapphire fibers by formation of nanometer scale cavities with hydrogen ion implantation;" AIP Journal of Applied Physics, Nov. 2013, 7 pages, vol. 114, Issue 20, AIP Publishing LLC, Albany, USA.

Brandon Augustus Wilson, et al. "Creation of an Internal Cladding in Sapphire Optical Fiber Using the 6Li(n, α)3H Reaction;" IEEE Sensors Journal, Nov. 2017, pp. 7433-7439, vol. 17, No. 22, IEEE, published online only.

*Primary Examiner* — Daniel Petkovsek
(74) *Attorney, Agent, or Firm* — Walter Haverfield LLP; James J. Pingor

(57) ABSTRACT

Provided is a cladded single crystal sapphire optical fiber. In one embodiment, the innovation provides a method for forming a cladding in a single crystal sapphire optical fiber by reactor irradiation. The reactor irradiation creates ions external to the fiber that enter the fiber, displace atoms in the fiber, and are implanted in the fiber, thus modifying the index of refraction of the fiber near the surface of the fiber and creating a cladding in the sapphire fiber.

8 Claims, 17 Drawing Sheets
(17 of 17 Drawing Sheet(s) Filed in Color)

(51) Int. Cl.
  *C30B 29/60* (2006.01)
  *G01L 11/02* (2006.01)
  *G01K 11/32* (2006.01)
  *G01B 11/16* (2006.01)
  *C30B 33/04* (2006.01)
  *G01D 5/353* (2006.01)
  *G02B 6/028* (2006.01)

(52) U.S. Cl.
  CPC ..... *G02B 6/02185* (2013.01); *G02B 6/02395* (2013.01); *G01D 5/35316* (2013.01)

(56) References Cited

U.S. PATENT DOCUMENTS

| | | | |
|---|---|---|---|
| 6,968,114 B2* | 11/2005 | Janney | G02B 6/02 |
| | | | 385/123 |
| 8,852,695 B2* | 10/2014 | Huang | G02B 6/03666 |
| | | | 427/523 |
| 8,934,093 B2* | 1/2015 | Huang | G01J 3/0218 |
| | | | 356/301 |
| 9,499,922 B2* | 11/2016 | Hsu | G02B 6/036 |
| 2011/0170823 A1* | 7/2011 | Xia | G01D 5/35303 |
| | | | 385/12 |
| 2014/0318273 A1* | 10/2014 | Dong | G01K 11/3206 |
| | | | 73/862.624 |

\* cited by examiner

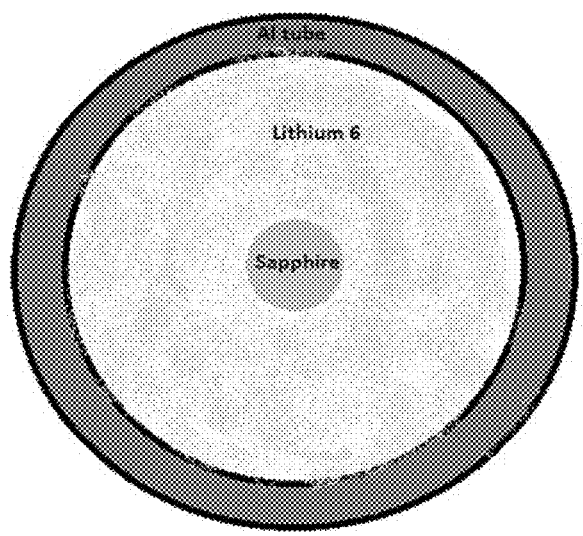 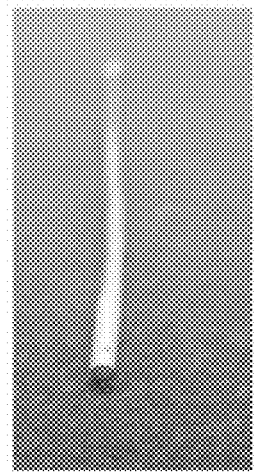
FIG. 1A                    FIG. 1B
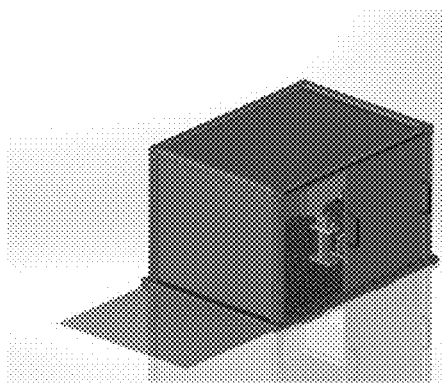 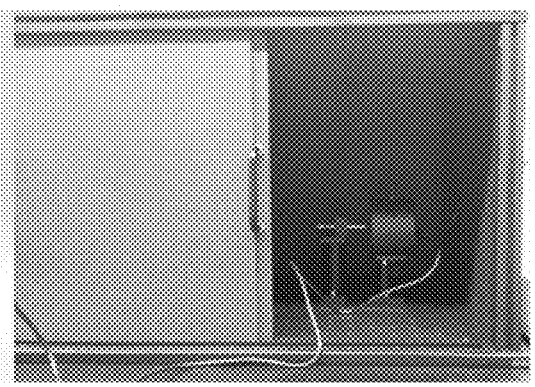
FIG. 2A                    FIG. 2B

INTERNAL CLADDING IN SAPPHIRE OPTICAL DEVICE AND METHOD OF MAKING SAME

CROSS-REFERENCE TO RELATED APPLICATIONS

This application claims the benefit of U.S. Provisional Patent Application Ser. No. 62/475,312 entitled "Creation of an Internal Cladding in Sapphire Optical Fiber by Reactor Irradiation" filed on Mar. 23, 2017, the entirety of which is incorporated by reference herein.

TECHNICAL FIELD

The innovation relates to internal cladding in sapphire optical devices and methods of making such sapphire optical devices having an internal cladding.

BACKGROUND

Because of their low cost, small mass, low signal attenuation over long lengths, immunity to electromagnetic interference and potential for high bandwidth data transfer, optical devices (e.g., fibers, wafers) have been developed for sensing applications. Optically based sensors may be used for measuring, for example, temperature, strain, pressure and acceleration with applications varying from smart structures, to the oil and gas industry, to the life science industry. Intrinsic optical sensors use the optical fiber itself as the sensing element. Examples of intrinsic optically based sensors are fiber Bragg grating sensors and intrinsic Fabry-Perot interferometric sensors. These sensors function well for single mode fiber, but function less well, or not at all, if the fiber is multimodal. Single crystal sapphire optical fiber can potentially operate at higher temperatures than silica optical fiber. However, whereas silica optical fiber can be manufactured such that it propagates a single optical mode, single crystal sapphire optical fiber is highly multimodal, due to its relatively large diameter and the large change in the index of refraction in passing from the sapphire fiber to the air that surrounds the fiber, when the fiber is used in air.

Optical fiber-based sensors are capable of distributed temperature and/or strain measurements with high accuracy and sub-cm spatial resolution. Optical fibers have a small diameter (~100 μm), a small mass (and therefore fast response time), and are fabricated from high temperature tolerant, radiation-hard materials. Optical fiber sensing is already used in the petroleum industry to measure the temperature and pressure profiles in down-hole applications. Other harsh environments in which optical fiber sensing is used include coal gasifiers and jet engines. The Nuclear Regulatory Commission has shown interest in using fiber optics for advanced instrumentation in high temperature next generation nuclear power plants. Specific applications include monitoring fuel performance during irradiation in test reactors, or embedding fibers in commercial reactor components or structures. Single crystal sapphire (e.g., $\alpha\text{-}Al_2O_3$) optical fiber has a melting temperature in excess of 2000° C. This is ideal for extremely high temperature sensing of, for example, fuel centerline temperature, during irradiation testing of metallic fuels and some oxide fuels. Unfortunately, sapphire optical fiber exhibits highly multimodal light transmission and is therefore unsuitable for most optical sensing techniques.

There are currently four different sensing techniques that can be applied to optical fibers to produce distributed sensing along the fiber (Optical Frequency Domain Reflectometry, Optical Time Domain Reflectometry (OTDR), Stimulated Brilloiun Scattering and Bragg Grating Sensing). With the exception of Raman-based distributed sensing, a type of OTDR sensing that has been demonstrated in sapphire fiber to temperatures up to 1200° C., most sensing techniques require nearly single mode light transmission in an optical fiber because the measurement is made by either interferometric or time of flight methods. For both methods, the measurements can be distorted by additional light modes in the fiber.

Optical Frequency Domain Reflectometry (OFDR) is a distributed measurement technique that works on the principles of injecting light into an optical fiber and measuring the reflected light off reflection points caused by natural defects or intentionally inscribed defects in the fiber. First, a 'map' of the reflection points within the fiber is made at a known temperature (usually room temperature). As temperature or stress causes the fiber to expand or contract, the location of these reflection points moves. The measurement of their movement can be correlated to temperature or strain. The OFDR technique has been successfully used to measure temperature or strain with silica optical fibers.

The Optical Backscatter Reflectometer (OBR) OBR4600 produced by Luna Innovations uses the OFDR technique to interrogate optical fibers and is the instrument that was used for this work. The OFDR technique only works if the fiber is nearly single mode. If the optical fiber supports multiple light modes, the time of flight measurement will be distorted relative to the time of flight for the primary mode, because the light can travel along different path lengths in the fiber. Luna Innovations has used multimode fiber for temperature and strain measurements; but to do so, the multimode fiber had to be aligned perfectly with a single mode fiber, so that only a few light modes would be injected into the multimode fiber. Also, the multimode fiber could not be bent. Presently, only silica optical fibers are used with the OFDR technique, because they can be made to support only a single light mode and because they have inherent reflection points within them that are due to defects and density changes of the amorphous silica glass structure. Sapphire fiber's multimodal nature, due to its large core and the lack of a cladding, along with the deficiency of defects in sapphire, due to its crystalline structure, makes the interference based OFDR sensing technique fail with normal sapphire fiber.

Silica glass based optical fibers have a maximum temperature range of approximately 800° C., due to the limitations of the silica glass (transmission through the glass decreases and reflection points evolve dramatically around that temperature). Single crystal sapphire optical fibers transmit light at temperatures well above 800° C. They would potentially provide a sufficiently high operating temperature for temperature measurements to be made for fuel pins and in other high temperature regions in a reactor using OFDR, if sapphire fiber could be made sufficiently single mode in its transmission characteristics.

SUMMARY

The following presents a simplified summary of the innovation in order to provide a basic understanding of some aspects of the innovation. This summary is not an extensive overview of the innovation. It is not intended to identify key/critical elements of the innovation or to delineate the scope of the innovation. Its sole purpose is to present some concepts of the innovation in a simplified form as a prelude to the more detailed description that is presented later.

According to an aspect, the innovation provides a sapphire optical fiber having an azimuthally uniform internal cladding along the entirety of a fiber. In one embodiment, the innovation provides a cladding in single crystal sapphire optical fiber. In one embodiment, the innovation provides a method for forming a cladding in a single crystal sapphire optical fiber by reactor irradiation. The reactor irradiation creates ions external to the fiber that enter the fiber, displace atoms in the fiber, and are implanted in the fiber, thus modifying the index of refraction of the fiber near the surface of the fiber and creating a cladding on the sapphire fiber.

In one embodiment, a cladding was created that was internal to the fiber by irradiation of the fiber with ions that were created in a (neutron, charged particle) reaction that occurred in a radiator material that surrounded the fiber and was external to the fiber. Irradiation of the fiber may be accomplished using any (neutron, charged particle) reaction, including any neutron source, but not limited to $^6$Li(neutron, alpha)$^3$H or $^{10}$B(neutron, alpha)$^7$Li reactions with a radiator containing $^6$Li or $^{10}$B using a Reactor as a source of neutrons. In one embodiment, irradiation may take place in a Research Reactor. Specifically, irradiation was performed in the Ohio State University Research Reactor.

The creation of a cladding in a sapphire optical fiber may extend optical frequency domain reflectometry sensing to the sapphire optical fiber. In one embodiment, the cladding was created by irradiating a sapphire optical fiber, which was surrounded by an annulus of Li-6 enriched lithium carbonate ($Li_2CO_3$) powder. The $^6$Li(n,α)$^3$H reaction created high energy alpha particles and tritons that irradiated the fiber simultaneously to a depth of 24 microns along the entire periphery of the sapphire fiber, thereby slightly reducing the index of refraction in the fiber's periphery and creating a cladding within the fiber. Transmitted light intensity profiles show that the ion implanted cladding made the fiber's intensity profile nearly single mode. The cladding survived to the highest temperature that was tested (1500° C.). The cladding made the fiber sufficiently single mode that the cladded sapphire fiber, when read out with an optical backscatter reflectometer, produced distributed temperature measurements along the entire length of the fiber.

To the accomplishment of the foregoing and related ends, certain illustrative aspects of the innovation are described herein in connection with the following description and the annexed drawings. These aspects are indicative, however, of but a few of the various ways in which the principles of the innovation can be employed and the subject innovation is intended to include all such aspects and their equivalents. Other advantages and novel features of the innovation will become apparent from the following detailed description of the innovation when considered in conjunction with the drawings.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

FIG. 1A is a cross sectional diagram of a Li-6 irradiation set-up according to an embodiment of the innovation consisting of sapphire fiber in the middle of a 1 mm inner diameter Aluminum tube that is filled with Li-6 carbonate powder. FIG. 1B is a photograph of irradiation setup corresponding to diagram in FIG. 1A.

FIG. 2A is a diagram of a dark box that may be used to measure the light transmission through optical fibers of an embodiment of the innovation. FIG. 2B is a photograph of a dark box and fiber optic transmission experimental setup used in the development of the present innovation.

DETAILED DESCRIPTION

Figure 3A:
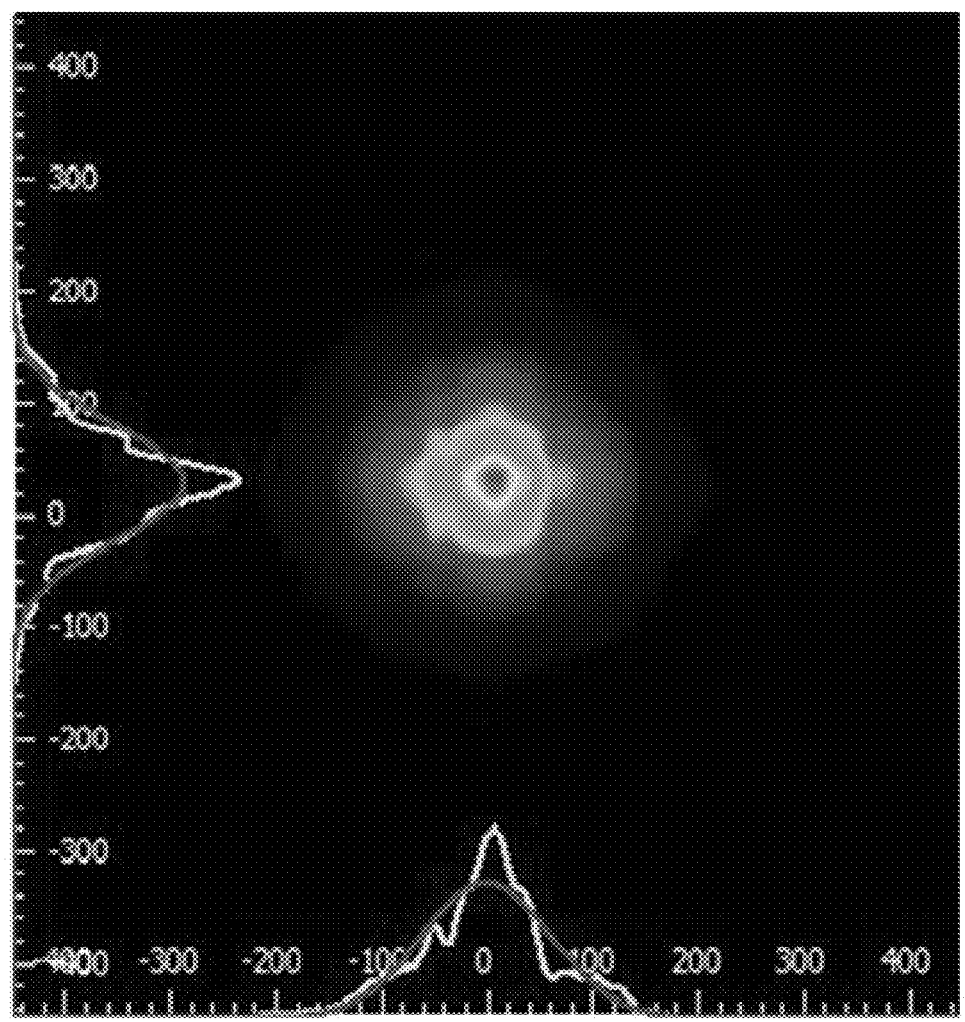
FIGS. 3A-3C are 2-D images of transmission data through multimode silica fiber (FIG. 3A), sapphire fiber prior to irradiation (FIG. 3B), and sapphire fiber post irradiation (FIG. 3C).

The innovation is now described with reference to the drawings, wherein like reference numerals are used to refer to like elements throughout. In the following description, for purposes of explanation, numerous specific details are set forth in order to provide a thorough understanding of the subject innovation. It may be evident, however, that the innovation can be practiced without these specific details. In other instances, well-known structures and devices are shown in block diagram form in order to facilitate describing the innovation.

According to an aspect, the innovation provides a sapphire optical fiber having a uniform internal cladding. In one embodiment, the innovation provides a cladding in single crystal sapphire optical fiber. In one embodiment, the innovation provides a method for forming a cladding in a single crystal sapphire optical fiber by reactor irradiation. The reactor irradiation creates ions external to the fiber that enter the fiber and displace atoms in the fiber, thus modifying the index of refraction of the fiber near the surface of the fiber and creating a cladding on the sapphire fiber.

A cladding is important for sapphire optical fiber for two reasons: 1) it protects the fiber from the environment, and 2) it reduces the number of light modes in the fiber. Regarding 1), the fibers are susceptible to the effects of substances on the surface of the fiber and non-uniformities on the surface of the fiber that are due to the manufacturing process. Regarding 2), sapphire optical fibers are produced with radii on the order of 38 to 50 micrometers, which is large compared to the radius of the core of a single mode silica fiber, which is on the order of 4 micrometers in radius. The multimodality of optical fibers decreases with decreasing fiber core radius. Therefore, sapphire fibers are multimodal as a consequence of their large radii, and creating a cladding that is internal to the fiber reduces the radius of the fiber's core and hence decreases the fiber's multimodality. Also, sapphire fibers are highly multimodal, because of the large difference in the index of refraction ($\eta$) between the sapphire fiber and air (for example, at room temperature and for light at 1550 nm, $\eta_{sapphire}$=1.75 and $f_{air}$=1.0) [10]. Although $\eta_{sapphire}$ changes with temperatures, the difference in $\eta$ remains large at high temperatures.

In order to make distributed temperature measurements in sapphire optical fiber using OFDR, light has to be nearly single mode and thus uncladded sapphire fiber does not work well for this application. A suitable cladding for sapphire optical fibers must have: 1) a high melting temperature, 2) a lower $\eta$ than $\eta_{sapphire}$ (and preferably a refractive index close to 1.75), 3) inertness at high temperatures, 4) a coefficient of thermal expansion identical to sapphire's and 5) good bonding with sapphire. The first property is a requirement because the cladding must be able to survive high temperatures (above 1000° C.), since sapphire fibers' big allure is its high temperature capability. If the cladding does not match sapphire's high temperature limits, then the cladded sapphire fiber would be non-competitive in comparison to existing silica fiber, which is cheaper, mass produced in long lengths and more easily implemented. The second property helps reduce the number of light modes that can travel through the fiber, because a cladding with a $\eta$ that is slightly less than $\eta_{sapphire}$ will reduce the transmission of higher order light modes. The third, fourth and fifth properties address the stress that a cladding could put on a sapphire fiber at high temperatures. Any non-uniform expansions that are due to a mismatch in the thermal expansion coefficient, between the clad and the fiber or that is due to a chemical interaction between the medium and the clad, could cause stress on the fiber, which might cause the fiber to break.

There have been many attempts at creating an external cladding for sapphire, but most have been unsuccessful, due to either mismatched thermal expansion coefficients or a poor bond between the clad material and the sapphire fiber. The most common method for creating an external cladding on sapphire fiber is vapor deposition of a material onto the fiber surface. For example, metal coatings (e.g., aluminum, titanium, silver and platinum) have been shown to be successful up to 1000° C., but fail above that temperature, due to thermal mismatches. Refractory compounds ($ZrO_2$, $Ta_2O_5$, $TiO_2$, $Si_3N_4$, SiC) have been tried also, but have failed, at temperatures around 1200° C., due to thermal mismatch or poor bonding.

An external cladding with $\eta_{clad}$ slightly less than $\eta_{sapphire}$ would not fully address the issue of the fiber being multimodal, because the core would still be of large enough radius to support multiple light modes. A more optimal clad would be internal to the fiber, thus decreasing the radius of the fiber core.

An accelerator was successfully used to create an ion implanted waveguide in a sapphire wafer. The ion damage survived up to 1600° C. Use of an accelerator to create a cladding on the periphery of a sapphire fiber, along the entire length of the fiber, would take an unreasonably long time and would be consequently very expensive.

According to the innovation, a method of reducing $\eta$ in sapphire by ion implantation is disclosed. In one aspect, the innovation provides a new method for implanting the ions. In one embodiment, the method for implanting ions in sapphire fiber may include surrounding a sapphire fiber with a thin annulus of Li-6 enriched lithium carbonate powder and irradiating the fiber in a nuclear reactor.

In one embodiment, a cladding was created, which was internal to the fiber, by irradiation of the fiber with ions that were created in a (neutron, charged particle) reaction that occurred in a radiator material that surrounded the fiber and was external to the fiber. Irradiation of the fiber may be accomplished using any (neutron, charged particle) reaction, including any neutron source, but not limited to $^6$Li(neutron, alpha)$^3$H or $^{10}$B(neutron, alpha)$^7$Li reactions with a radiator containing $^6$Li or $^{10}$B using a Reactor as a source of neutrons. In one embodiment, irradiation may take place in a Research Reactor. Specifically, in one example, irradiation was performed in the Ohio State University Research Reactor.

Irradiation created a layer of high density displacement defects in the fiber outer surface. In one embodiment, the innovation provides a method of creating a uniform cladding. In one example, the $^6$Li(neutron, alpha)$^3$H reaction, seen below in Equation 1, was utilized to create an azimuthally uniform layer of damage, on the periphery of the fiber, along the entire length of a fiber, from the high energy alpha particles and tritons that were emitted in the $^6$Li(neutron, alpha)$^3$H reaction. The alpha and triton particles created displacement defects in the crystal to a depth of about 15 micrometers in the sapphire fiber and, thus, formed an azimuthally uniform internal cladding along the entire length of a fiber.

$$_3^6Li + _0^1n \rightarrow _2^4He + _1^3H + 4.8 \text{ MeV} \qquad \text{Equation 1}$$

According to an aspect, the innovation provides an intrinsic cladding in an optical fiber by irradiating the fiber with ions that are created in a (neutron, charged particle) reaction, such as the reaction that is shown in Equation 1, with the neutrons produced by irradiation in a nuclear reactor. The changes in the optical properties of the fiber that create the cladding are a consequence of displacement of atoms in the fiber by the bombardment of ions that are produced by reactor irradiation. The reactor irradiation creates ions external to the fiber that enter the fiber and displace atoms in the fiber, thus modifying the index of refraction of the fiber near the surface of the fiber and creating a cladding on the sapphire fiber. Experimental results indicate that the cladding produced according to the innovation was inscribed and shown to work in a sapphire optical fiber.

In one embodiment, the sapphire optical fiber comprising internal cladding according to the innovation may be part of a system or device that includes a fiber-optic based sensor. Presently, temperature and strain sensors, thermocouples and conventional electronically-based strain gauges are standardly used to measure temperatures and strains in normal environments. However, these standard technologies are expensive and/or have limited functionality in high temperature environments. Consequently, silica-based fiber-optic sensors have recently been implemented to measure temperature and strain in high temperature, harsh environments. Presently, these fiber-optic based sensors have a maximum temperature range of around 800° C., due to the limitations of the silica glass fibers (transmission through the glass breaks down around that temperature). Sapphire fiber can transmit light at much higher temperatures, possibly up to 1800° C. However, no one has been able to use sapphire optical fibers in a distributed temperature measurement system due to the lack of cladding for the sapphire fiber. The use of an optical fiber comprising a clad that is internal to a sapphire fiber according to the innovation can be used to make distributed temperature measurements. In addition, the upper temperature limit for temperature measurements with optical fibers according to the innovation could surpass the temperature limit for silica fibers (the current state of the art) by at least 1000° C.

Traditional thermocouples and strain sensors have drawbacks that prevent their implementation in some harsh environments. For example, thermocouples do not work well in harsh environments, where the sensing metals can be degraded by environmental factors. Also, thermocouples are bigger than optical fiber-based sensors and each thermocouple can only measure temperature at one point.

Optical fiber-based sensors are available for measuring temperature and strain in harsh environments, with applications varying from smart structures, to the oil and gas industry, to the nuclear power industry. The current state of the art uses silica fiber. Sapphire fiber is not used because it is highly multimodal and without a cladding. The sapphire fiber with internal cladding as disclosed in the present innovation reduces the amount of light modes in the sapphire optical fiber, so that the fiber can be used for distributed temperature measurements.

Current technology is limited to distributed temperature sensing in silica fiber or single point (at best) measurements using sapphire fiber. The sapphire fiber with internal cladding according to the innovation enables temperature sensing along the entire length of a sapphire fiber. Besides temperature sensing, clad sapphire fiber could also be used in the laser industry.

Moreover, it is to be understood that the innovation includes an ability to splice sapphire to glass. More particularly, a splicing process is possible that enables the connection or linking of sapphire to glass thereby further enhancing cost advantages while leveraging the high temperature capabilities of the innovation, for example, as related to optical fibers and other sensor applications. In other words, the clad sapphire optical fiber in accordance with the innovation can be employed in high-temperature environments whereby, a lower cost glass optical fiber can be employed in less harsh environments while maintaining the continuity of the optical fiber.

In one embodiment, the cladded sapphire fiber may include Bragg gratings. A Bragg grating is an intentional cluster of defects in an optical fiber that cause a change in the index of refraction, which causes a reflection of the light in the optical fiber. Bragg gratings are typically used, in silica glass fibers, as either temperature sensors or light filters. The Bragg gratings in silica optical fiber are traditionally created with a UV laser. They are called type-I gratings. The laser creates defects in the core of the fiber using a photosensitive reaction, between the core and the UV laser, resulting in a change in the index of refraction. Unfortunately, type-I gratings typically recombine and anneal out of silica glass fiber at temperatures around 800° C. Use of a femtosecond laser has been used to form type-II gratings in sapphire optical fiber. These type-II Bragg gratings in sapphire optical fiber have been tested and are temperature stable up to 1500° C. However, due to the multimodal nature of sapphire fiber, only one Bragg grating can be analyzed as a temperature sensor in a sapphire fiber. With a cladded sapphire optical fiber according to the innovation, an array of Bragg gratings in a sapphire fiber could be read out, or used as strong reflections in the fiber for OFD Reflectometry.

In another embodiment, the cladded sapphire fiber may include defects that have been intentionally added to the fiber by irradiation of the fiber with a femtosecond laser. Such a fiber, with enhanced defects, has a correspondingly enhanced Rayleigh backscatter signal, when it is readout with an Optical Backscatter Reflectometer. Such readout is possible, for a fiber with enhanced Rayleigh backscatter, if a clad is added to the fiber according to the innovation.

In another embodiment, the sapphire may be in other geometrical forms than that of a fiber. For example, another geometrical form is that of a sapphire wafer. Sapphire wafers, and sapphire of other geometries, may include an internal cladding or variation in the index of refraction that is formed according to the innovation, which causes a reflection or refraction of the light in the sapphire. Presently, sapphire wafers are being implemented onto silicon chips to act as waveguides for chip-based photonic devices. In particular, silicon chip-based spectroscopy devices use sapphire wafers as a waveguide for their sensing medium. An internal cladding, or variation in the index of refraction that is formed as disclosed in the present innovation, can be applied to sapphire wafers and sapphire of other geometries to improve the sapphire's performance as a waveguide.

Example 1

A sapphire fiber was surrounded with Li-6, in the form of Li-6 enriched lithium carbonate powder (95.8 atomic percent Li-6), and placed the fiber in the Ohio State University Research Reactor (OSURR). The $_3^6Li(n, \alpha)_1^3H$ reaction, $_3^6Li+_0^1n \rightarrow _2^4He+_1^3H+4.8$ MeV, created high energy alpha particles and tritons that irradiated the fiber simultaneously along the entire periphery of the sapphire fiber. The $_3^6Li(n, \alpha)_1^3H$ reaction creates an alpha particle that has an energy of 2.05 MeV and a triton that has an energy of 2.73 MeV. The alpha particle has a range of 4 micrometers in sapphire, while the triton has a range of 24 micrometers. The large depth of the triton implantation reduces the core size of the sapphire fiber, which helps reduce the multimodal characteristics of the sapphire.

In addition to creating the cladding from ion irradiation via the $_3^6Li(n, \alpha)_1^3H$ reaction, which is induced mostly by thermal neutrons, the reactor irradiation also created displacement damage throughout the sapphire fiber core, as a consequence of fast neutron interactions with the nuclei of the aluminum and oxygen atoms composing the fiber. Consequently, by using the OSURR, a cladding within the fiber via the $_3^6$Li(n, $\propto$)$_1^3$H reaction and defects in the sapphire fiber core via fast neutron induced displacement damage were simultaneously created. Because the reaction rate for the $_3^6$Li(n, $\propto$)$_1^3$H reaction far exceeds the reaction rate for the creation of Primary Knock-on Atoms (PKAs) by fast neutron interaction with the sapphire, the radiation damage to the periphery of the fiber that created the fiber clad far exceeded the radiation damage to the fiber core that was created by fast neutron induced PKAs. The fast neutron induced damage in the fiber core can be viewed as being beneficial, because it was not substantial enough to greatly degrade transmission through the fiber, but was still large enough to create a Rayleigh backscatter signature within the fiber core. This backscatter signal provided the reflected light that was necessary for the functioning of the Luna OBR-4600. Because the sapphire fiber has a nearly perfect crystal structure, there may have otherwise been an insufficient number and intensity of defects for the OBR to be used with the sapphire fiber to measure temperature.

Irradiation Procedure

Figure 5:
FIG. 5 is a photograph of the OSURR core in water filled reactor pool.
Figure 6:
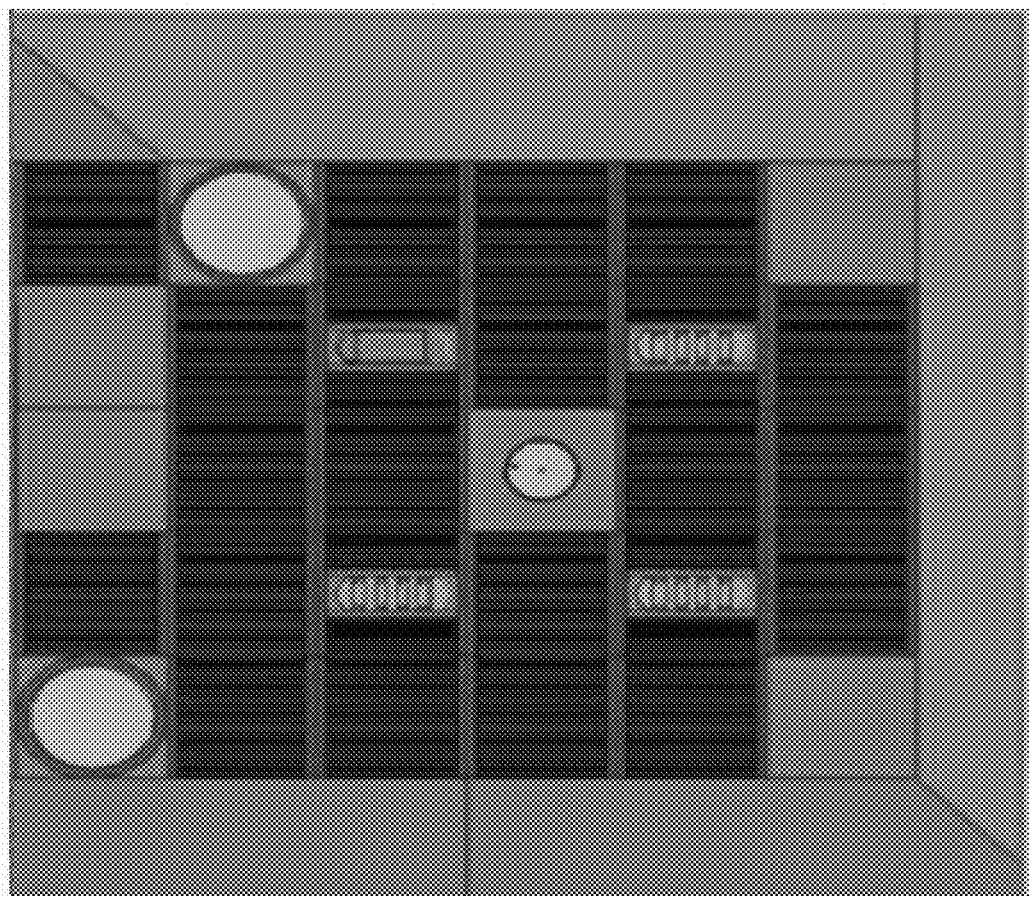
FIG. 6 is a VISED transverse cross-sectional image of the OSURR core at the core vertical mid-plane, including the CIF facility into which the Li-6 carbonate/sapphire fiber irradiation assembly was placed.

The ion implantation method developed for creating an internal cladding in sapphire optical fiber involved surrounding the sapphire fiber with Li-6 in the form of Li-6 carbonate powder and placing it (henceforth called the Li-6 carbonate/sapphire fiber irradiation assembly) in a drywell facility (the Central Irradiation Facility (CIF)) in the OSURR. The OSURR core and the CIF into which the Li-6 carbonate/sapphire fiber irradiation assembly was inserted are shown in a photograph (FIG. 5) and with a VISED drawing (FIG. 6). VISED is a visual editor package in the Monte Carlo code system MCNP-6.

Figure 7:
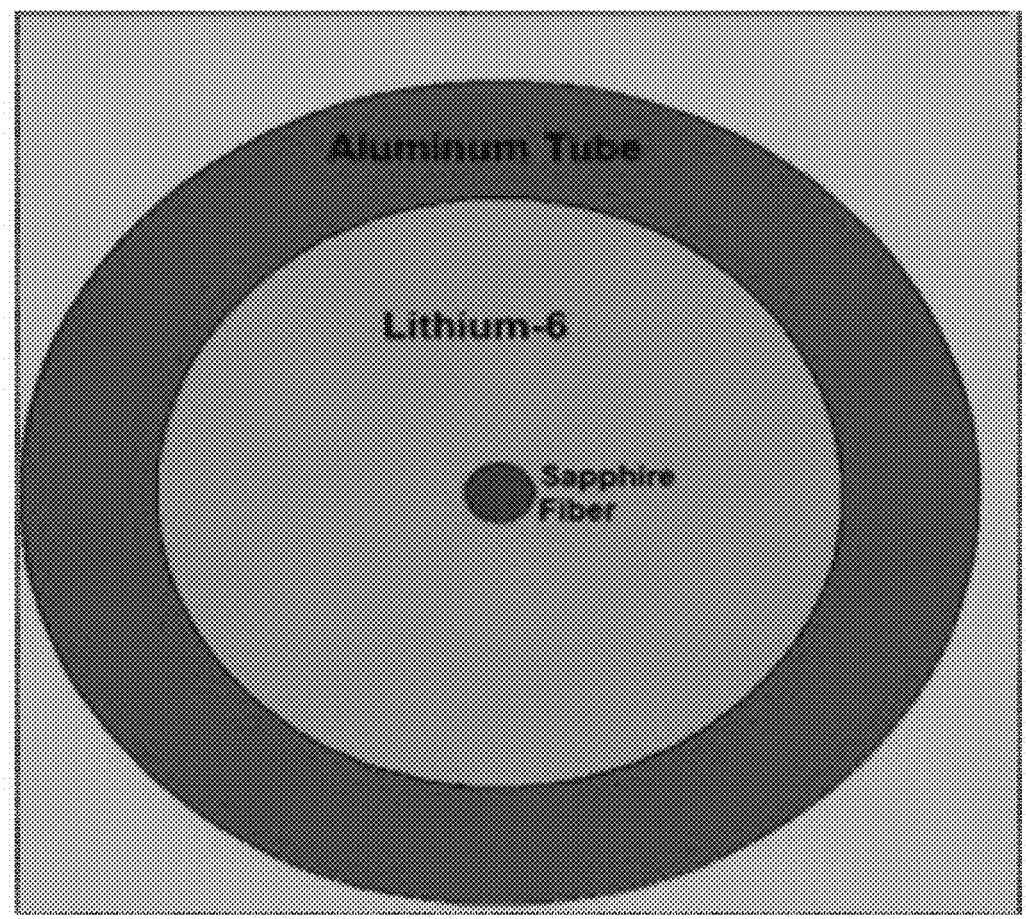
FIG. 7 is a VISED transverse cross-sectional image of the Li-6 carbonate/sapphire fiber irradiation assembly.

A VISED image of the cross section of the Li-6 carbonate/sapphire fiber irradiation assembly is shown FIG. 7. Sapphire optical fiber, with an outer diameter of 100 micrometers that was purchased from MicroMaterials Inc., was radially centered in an aluminum capillary tube (henceforth called the irradiation tube) that had an internal diameter of 1 mm. Lithium-6 carbonate powder was packed into the irradiation tube surrounding the sapphire fiber. It is to be appreciated that other materials may be suitable for the inner tube, so long as it is a material that can withstand irradiation by neutrons and does not become radioactive for long, when it is irradiated by neutrons.

The Li-6 carbonate had a Li-6 enrichment of 95.8 atomic percent and a (experimentally determined) density of approximately 0.7 g/cc. The ends of the irradiation tube were crimped to ensure that Li-6 powder would not fall out in the reactor and, to ensure safety, the crimped irradiation tube was placed in another aluminum tube (henceforth called the carrier tube) that was sealed with vacuum epoxy to create an air tight vessel. The carrier tube was then lowered into the CIF dry well facility of the OSURR core and irradiated for 5.5 hours at 450 kW for a total neutron fluence of $(6.1\pm0.6)$ $E+17$ n/cm$^2$ at the axial mid-plane of the OSURR core, which was also the approximate axial midpoint of the sapphire fiber. After irradiation, the sealed ends were snipped off the carrier tube and pliers were used to un-crimp the irradiation tube. The irradiation tube was placed in a fume hood and the tritium gas that was produced in the irradiation was allowed to vent for an hour. After the venting process, the irradiation tube was placed in water to dissolve all of the Li-6 carbonate powder around the fiber. The fiber was then pulled from the irradiation tube and tested to see if an internal cladding was created.

Transmitted Light Intensity Profile Testing

Figure 3B:
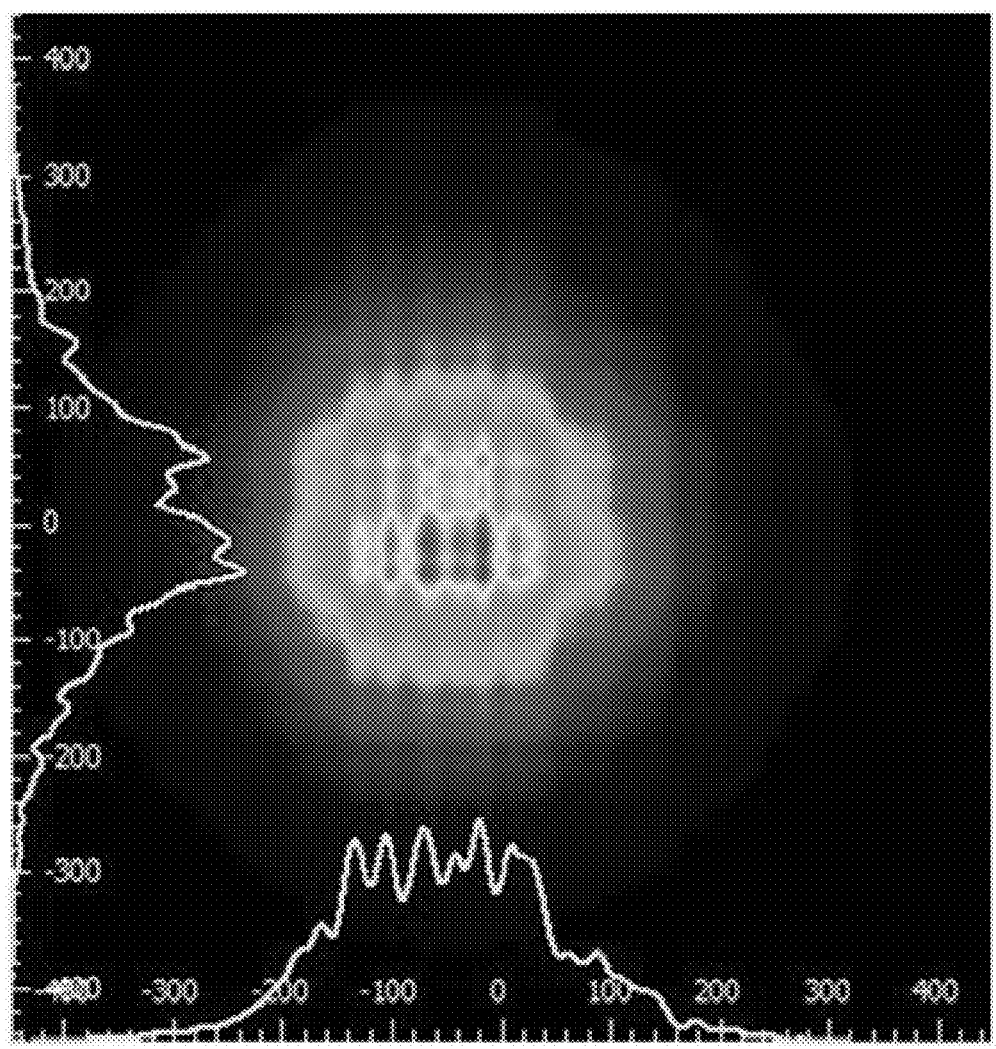
Figure 3C:
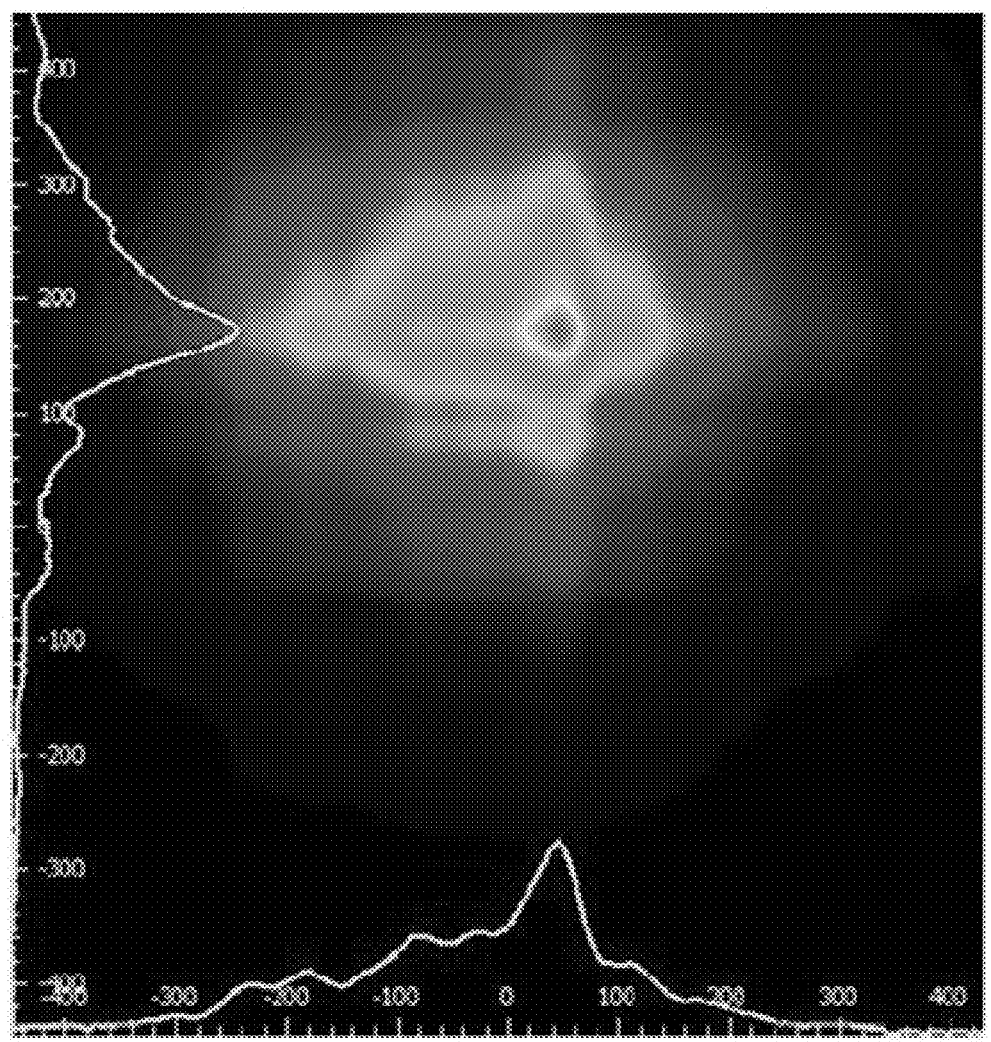
Figure 4A:
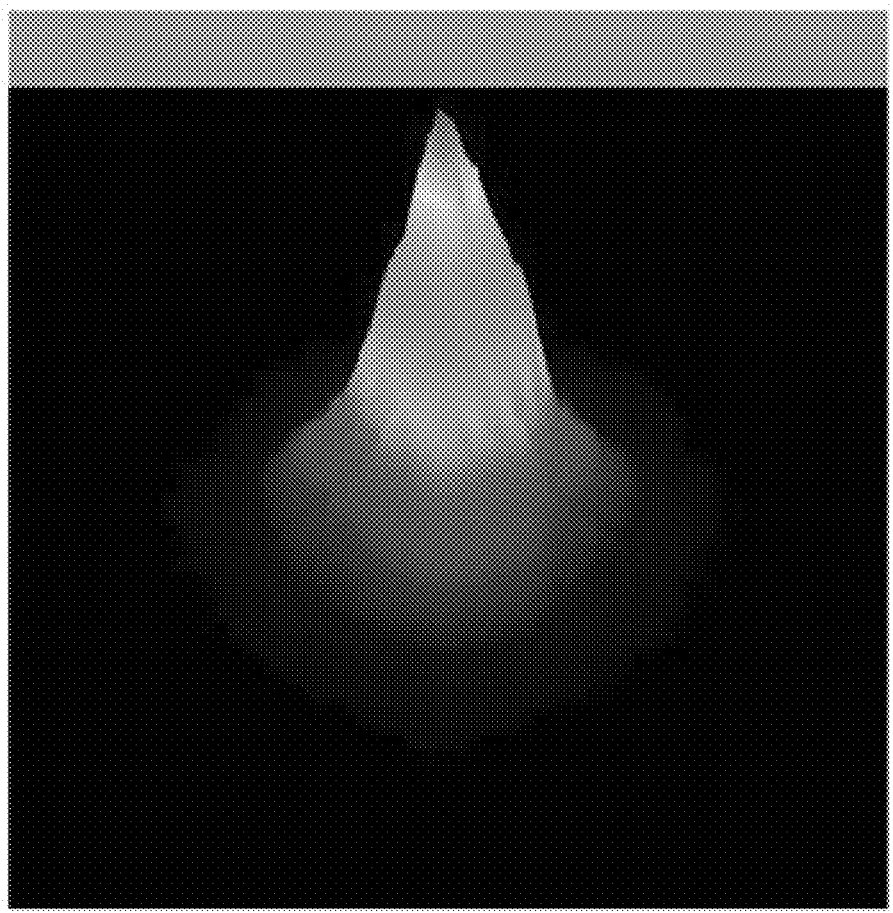
FIGS. 4A-4C are 3-D images of transmission data through multimode silica fiber (FIG. 4A), sapphire fiber prior to irradiation (FIG. 4B), and sapphire fiber post irradiation (FIG. 4C).
Figure 4B:
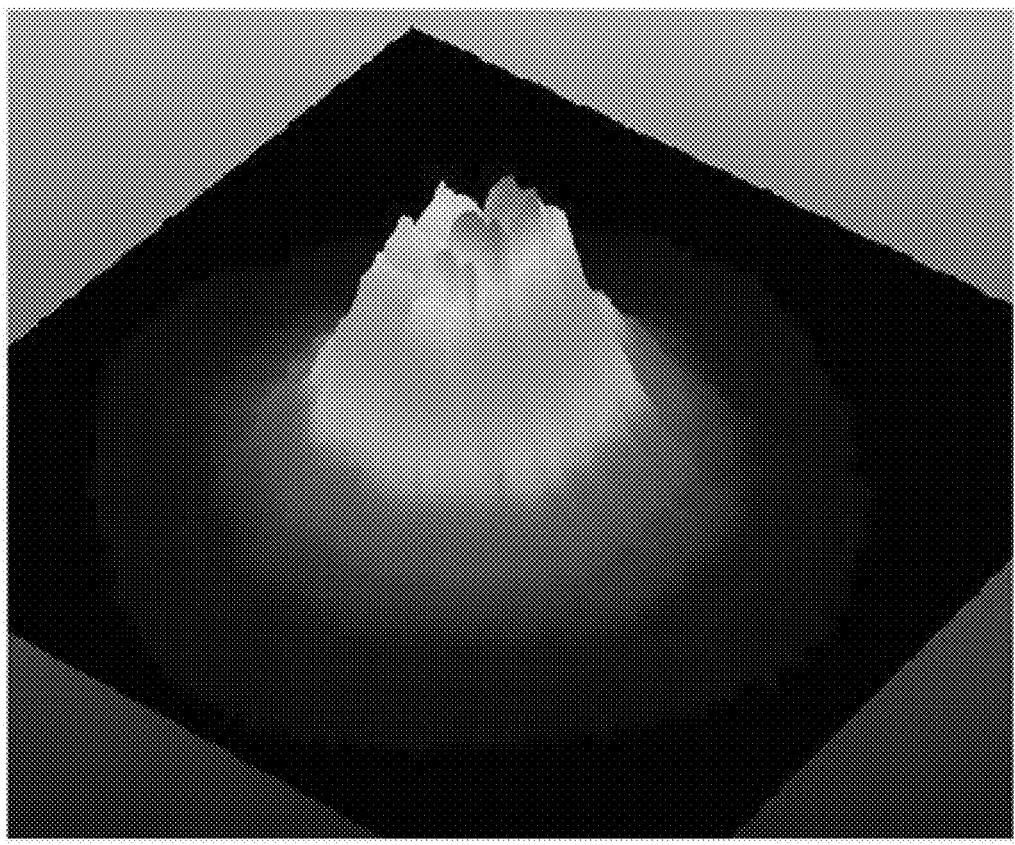
Figure 4C:
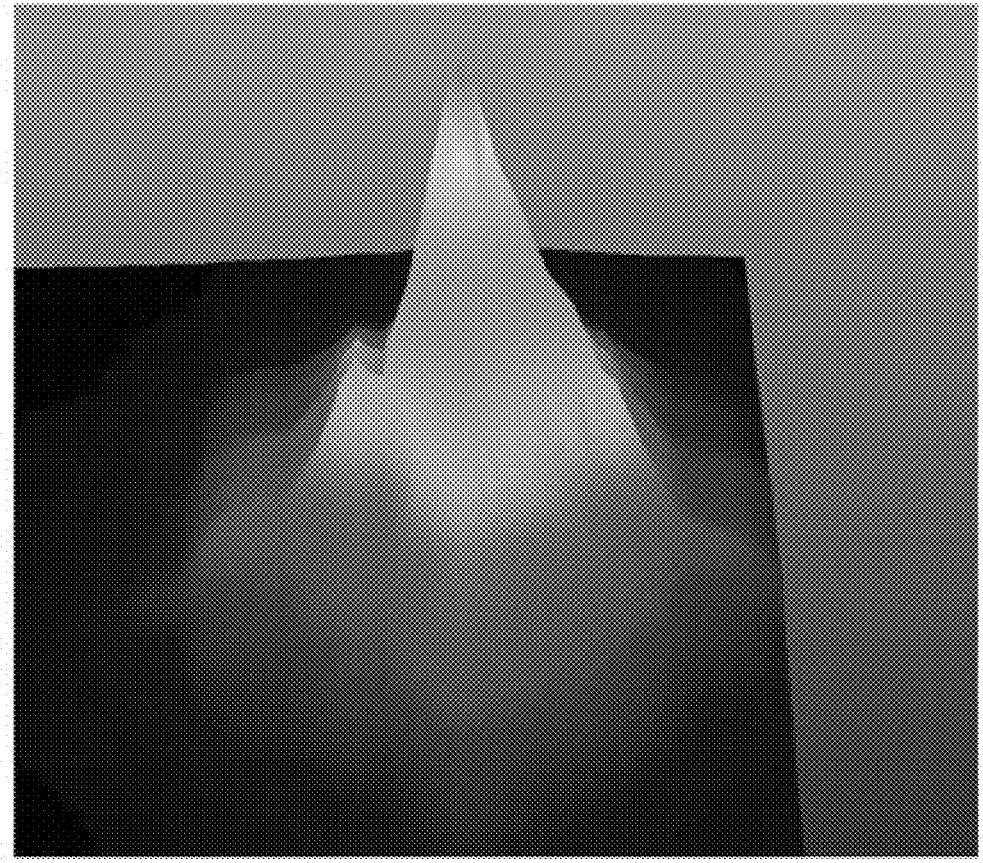

A dark-box light transmission facility was built to measure the light propagation though an optical fiber to test the effectiveness of the internal cladding of the sapphire fiber that were created. The setup used can be seen in FIGS. 2A and 2B. The sapphire fiber was placed in a fiber chuck and connected to an IR camera (Thorlabs BP-209 IR) to capture the beam profile of the light exiting the fiber. The IR camera came with a software package to analyze the light transmission data exiting the fiber, which produces images of light intensity as a function of location. A 1550 nm laser was then attached to other end of the fiber. Graded index silica fiber, virgin sapphire fiber and the sapphire fiber with the internal cladding were analyzed with the transmission facility. The transmission profile data for the various fibers can be seen below in 2-D and also in 3-D graphs in FIGS. 3A-3C and 4A-4C. The silica fiber (FIGS. 3A and 4A) had a transmission pattern with one distinct transmission peak in the center of the fiber that resembled a Gaussian shape. The virgin sapphire fiber (FIGS. 3B and 4B) did not have the same pattern. The light transmission was very multimodal and the light modes changed from picture to picture. The light transmission pattern appeared to have a shape that was more nearly a plateau than a Gaussian distribution and the light intensity did not have a central peak as it did for the silica fiber. FIGS. 3C and 4C show the light transmission pattern with the sapphire fiber with the cladding according to the innovation. It appears that the cladding is effective, because the transmitted light intensity has a central peak. The beam profile was not circular, which could be caused by either a bad endface and/or a lopsided cladding in the fiber. The nearly single mode light transmission characteristic of the internally cladded sapphire fiber prompted a test of the fiber's distributed temperature sensing capability.

Temperature Measurements with OBR

Figure 8:
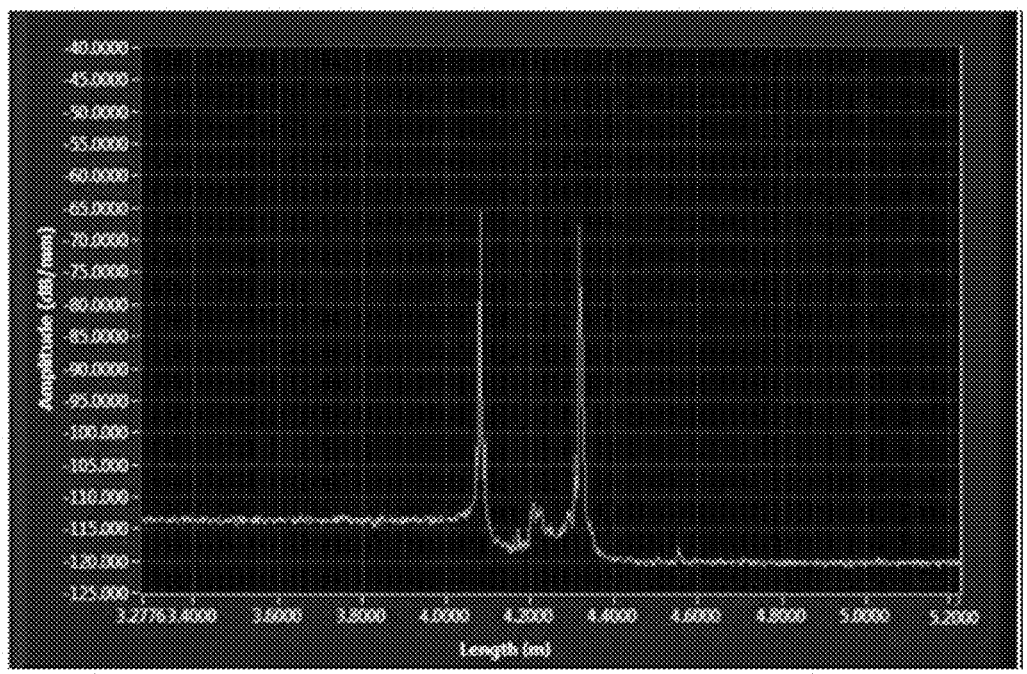
FIG. 8 depicts the OBR output of the reflected amplitude of light in the cladded sapphire optical fiber according to an embodiment of the innovation as a function of position along the fiber.

With the dark box images indicating that the cladded sapphire fiber had nearly single mode light transmission characteristics, the cladded sapphire fiber was attached to an optical backscatter reflectometer (OBR) to determine if the cladded fiber was capable of producing distributed temperature measurements. A screenshot from the OBR of the cladded sapphire fiber's backscattered light amplitude versus position along the fiber can be seen in FIG. 8. Lead silica fiber (corning SMF-28+) was fusion spliced to sapphire fiber using a customized OFS Fitel fusion splicer to cut down on cost, because sapphire fiber is expensive. Collaborating with Fitel, mode silica fiber with sapphire fiber with estimated coupling losses of less than 3 db. The first spike in reflectance (at ~4.075 m) is from the splice between the single mode silica fiber and the cladded sapphire fiber. The second spike in reflectance (at ~4.325 m) is from the end of the cladded sapphire fiber. The cladded sapphire fiber displays a reflected amplitude between 4.075 m and 4.335 m that is above the noise floor of 120 dB, which is the value of the reflected amplitude for positions greater than ~4.4 m. The reflected amplitude was not larger than the noise floor in similar measurements made using virgin sapphire fiber instead of reactor irradiated fiber. The defects from the fast neutron damage created enough scattering sites in the cladded sapphire fiber to create a backscatter signal above the noise floor, allowing the fiber to potentially be successfully used with the OBR to readout distributed temperature measurements.

Figure 9:
FIG. 9 is a photograph of a Li-6 cladded sapphire optical fiber according to an embodiment of the innovation strung along the length of a thermally cantilevered aluminum plate.

A short time duration heating test of the cladded sapphire fiber was conducted using a hot plate to determine if the cladded sapphire fiber could be successfully used to produce temperature measurements, using the OFDR sensing technique. An aluminum plate was thermally cantilevered on a hot plate and the fiber was strung along the top of the aluminum plate as shown in FIG. 9. A k-type thermocouple was placed near the fiber for comparison, at a point above the hotplate (length ~4.25 m). Multiple temperature measurements were made with the OBR and thermocouple every 150 seconds during the duration of the test.

Figure 10:
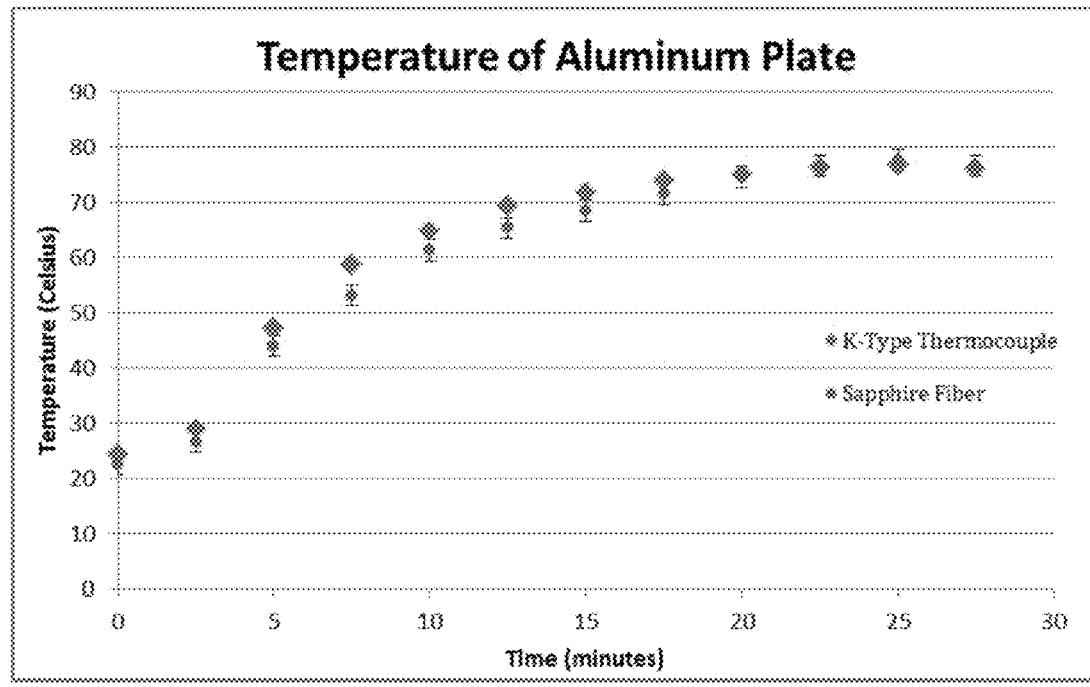
FIG. 10 is a graph of the temperature vs time for the cladded sapphire fiber and a k-type thermocouple placed on an aluminum plate above a hotplate, as the hotplate was turned on at time=0 with the hotplate set to 100° C. The fiber temperature is plotted for the point in the fiber nearest to the thermocouple (length ~4.25 m).
Figure 11:
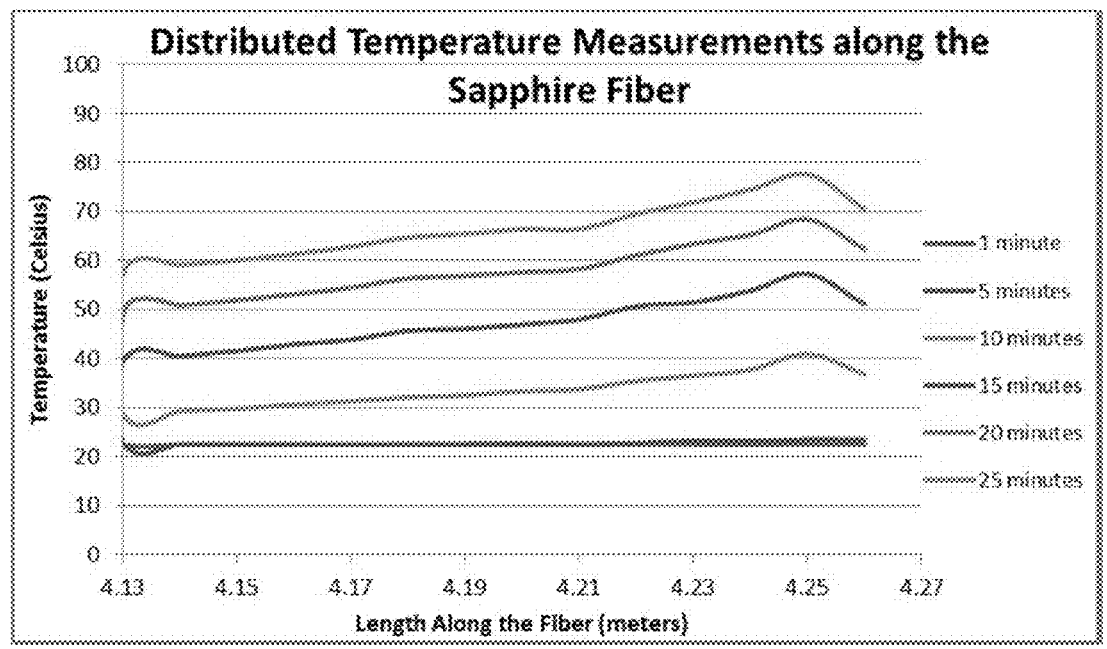
FIG. 11 is a graph depicting distributed temperature measurements of the sapphire fiber as a function of distance along the fiber with time as a parameter for the experiment corresponding to the data presented in FIG. 10.

The hot plate was heated up to 100° C. creating a distinctive temperature profile along the thermally cantilevered aluminum plate. The fiber and thermocouple temperatures are plotted versus time in FIG. 10. The fiber temperature is plotted for the point in the fiber nearest to the thermocouple (length ~4.25 m). Error bars on the sapphire measurements in FIG. 10 represent the standard deviation of the precision of the measurements; the accuracy of the OBR measurements of the sapphire fiber is still being investigated. FIG. 11 shows the distributed temperature measurements made by the sapphire fiber on the thermally cantilevered aluminum plate as a function of time during the experiment.

The temperature measurements in FIG. 10 indicate that the cladded fiber and the thermocouple record a similar temperature versus time history. The thermocouple was spaced about an inch away from the fiber, which could account for discrepancy between the measurements. FIG. 11 shows the spatial temperature profile of the plate along the length of the cladded fiber as the plate was heated with time as a parameter. The temperature profile resembles what would be expected from a heated cantilevered beam.

Transmitted Light Intensity Testing after High Temperature Irradiation

Having determined that temperature could be measured using cladded sapphire fiber and the OBR, a test was devised to determine the temperature limits of the ion implanted cladding. The cladded sapphire fiber was spliced to a single mode silica extension fiber and connected to the OBR. The sapphire fiber was placed into a tube furnace and the furnace was ramped to 1500° C. The furnace was held at 1500° C. for 24 hours, before the furnace was cooled back to room temperature. To confirm that the cladding remained intact, a transmission test was conducted after the high temperature experiment.

The cladded sapphire fiber was attached to the dark box light transmission system, as described previously, to determine if the cladding held up at high temperatures. The profile of the intensity of light transmitted through the cladded sapphire optical fiber can be seen in 2-D and 3-D in FIGS. 12A and 12 B, respectively.

Figure 12A:
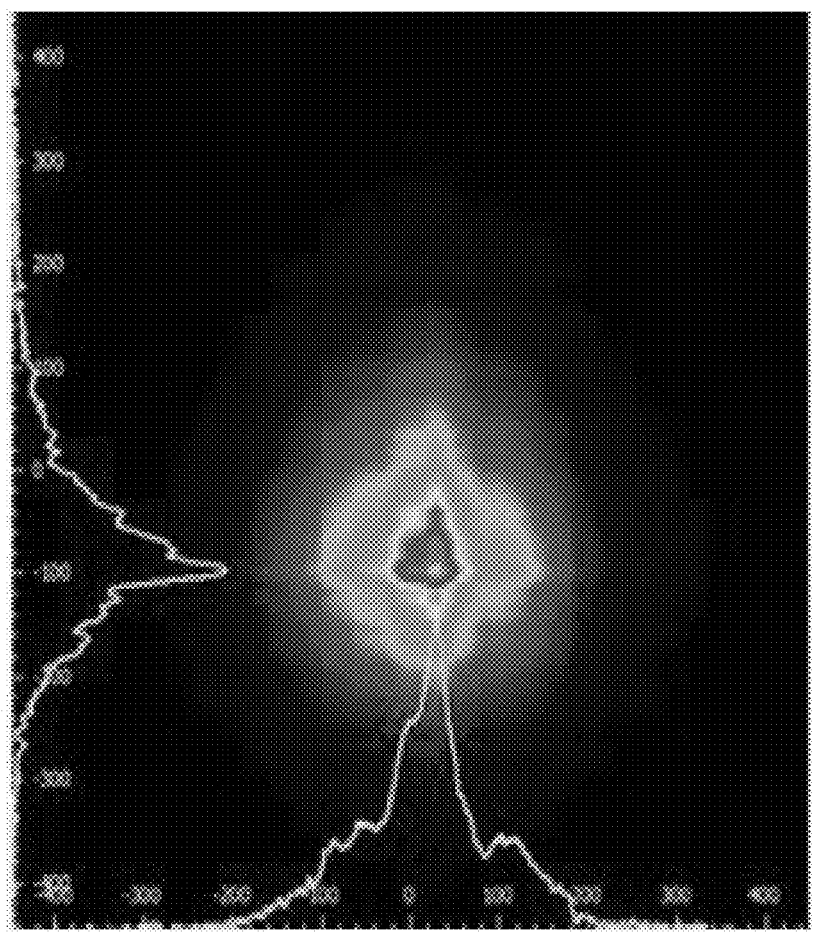
FIGS. 12A and 12B depict normalized light intensity measurements taken with an IR camera of the transmission profile for the post-heated sapphire cladded fiber in 2-D (FIG. 12A) and 3-D graphs (FIG. 12-B).
Figure 12B:
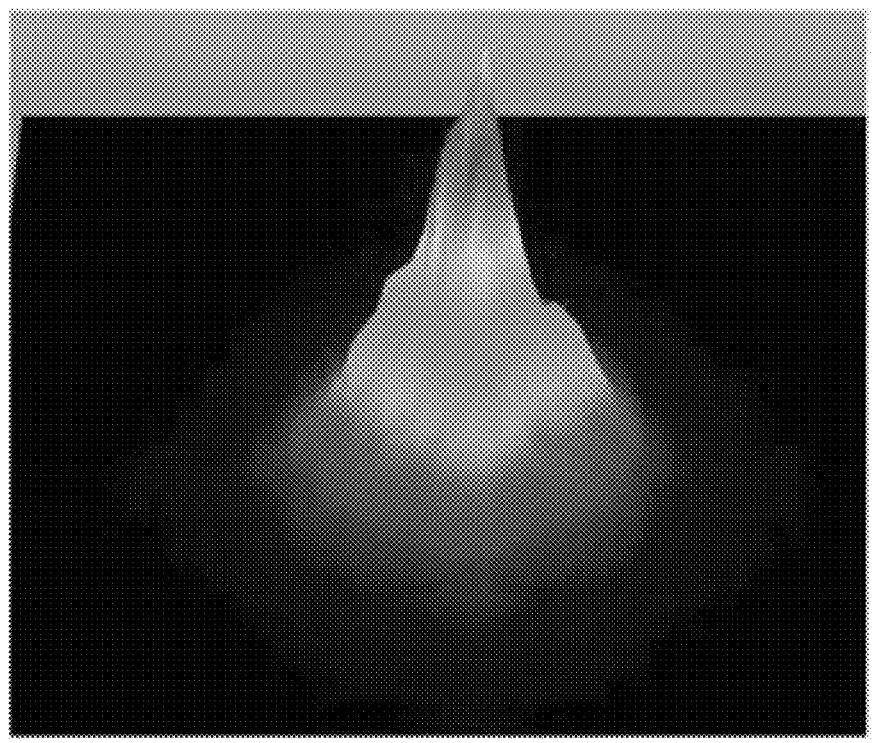

FIGS. 12A and 12B show that the sapphire fiber still exhibits nearly single mode light transmission, thus, indicating that the cladding is still present in the fiber after high temperature operation.

Example 2

A sapphire optical fiber that was tested in this experiment had a diameter of 100 microns, was inscribed with an array of type-II Bragg gratings and had an internal refractive cladding added to it. The sapphire fiber and the type-II Bragg gratings were manufactured by FemtoFiberTec. Upon the delivery of this fiber, an internal cladding was added to the fiber, using the $_3^6Li(n, \alpha)_1^3H$ reaction. The internal cladding in the sapphire fiber reduced the fiber's modality and enabled the gratings to be read out with an OFD reflectometer. The sapphire fiber was 14" long and had five type-II Bragg gratings inscribed into it. Corning SMF-28 optical fiber was fusion spliced to the sapphire fiber to serve as extension fiber and as a connection to the OFD reflectometer. A Luna Innovations OBR 4600 OFD reflectometer was used as a readout system for the fiber during the experiments. The OBR is capable of measuring distributed temperatures along a fiber via the OFD reflectometry sensing technique, which returns the optical phase shift for segments of the fiber, along the length of the fiber. In addition, the OBR can read out the Bragg wavelength from each Bragg grating along the fiber. Finally, the OBR can display the amplitude of the light that returns from the fiber to the OBR, as a function of distance along the fiber.

Figure 13:
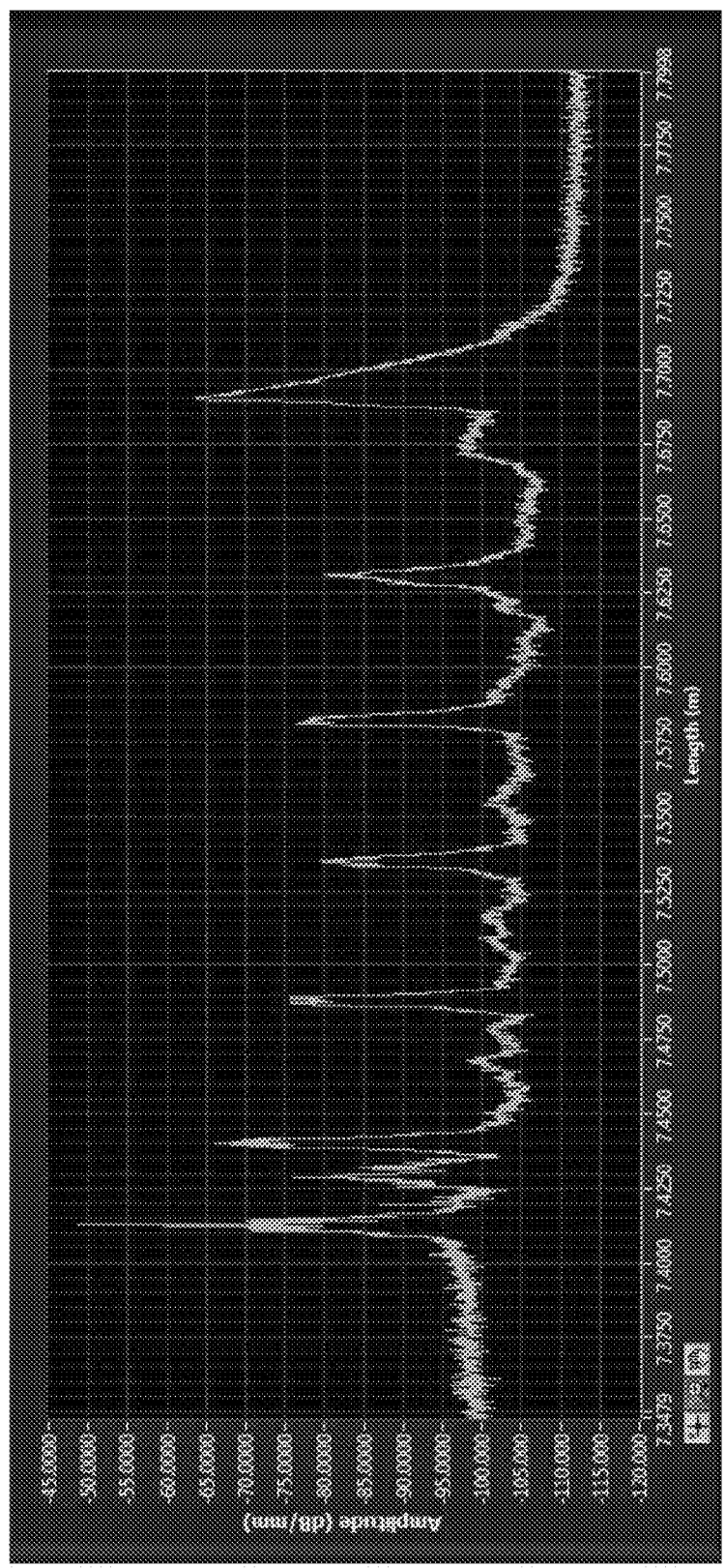
FIG. 13 is a screenshot from the OBR of the reflected amplitude of light in the cladded sapphire optical fiber as a function of position along a cladded sapphire fiber according to an embodiment of the innovation with type-II Bragg gratings inscribed into it, for the fiber at room temperature.

A screenshot from the OBR, of the reflected light amplitude versus position along the fiber, can be seen in FIG. 13, for the cladded sapphire fiber with type-II Bragg gratings inscribed into it, for the fiber at room temperature. It can be seen from FIG. 13 that the OBR is functioning well, with the cladded sapphire fiber with type-II Bragg gratings inscribed within the fiber. There are a number of spikes in the plot of reflected amplitude of light in the fiber versus position along the fiber. The first spike in the reflected amplitude (at ~7.42 m) is from the splice between the single mode silica fiber and the cladded sapphire fiber. The spike in the reflected amplitude from the end of the sapphire fiber is located at ~7.7 m. The 5 spikes in the reflected amplitude, between the fiber splice and the end of the fiber, are the femtosecond Bragg gratings. The gratings had a reflectivity of ~1-2% and were spaced every 6 cm along the fiber. For future reference in this document, the gratings were numbered (1 to 5) from left to right along the fiber, as seen in FIG. 13.

A custom tube furnace was constructed to heat the sapphire fiber. The tube furnace (Micropyretics Heaters International, Robust Radiator) consisted of a molybdenum di silicide heating coil embedded in refractory formed ceramic insulation (rigid insulation) surrounded by an outer layer of silica-based fibrous insulation. The tube furnace was capable of heating materials to temperatures up to 1600° C. Custom endcaps were made to insulate the penetrations in the furnace, by reducing the openings of the furnace to only a few centimeters. Sapphire optical fiber was routed through the furnace and the sapphire-to-silica fusion splice was located just outside of the heated zone. The first grating in the sapphire fiber was at the entrance of the furnace; and consequently, only 4 gratings were located in the heated region. K-type and B-type thermocouples were instrumented throughout the furnace, to serve as a basis of comparison for the fiber measurements.

Figure 14:
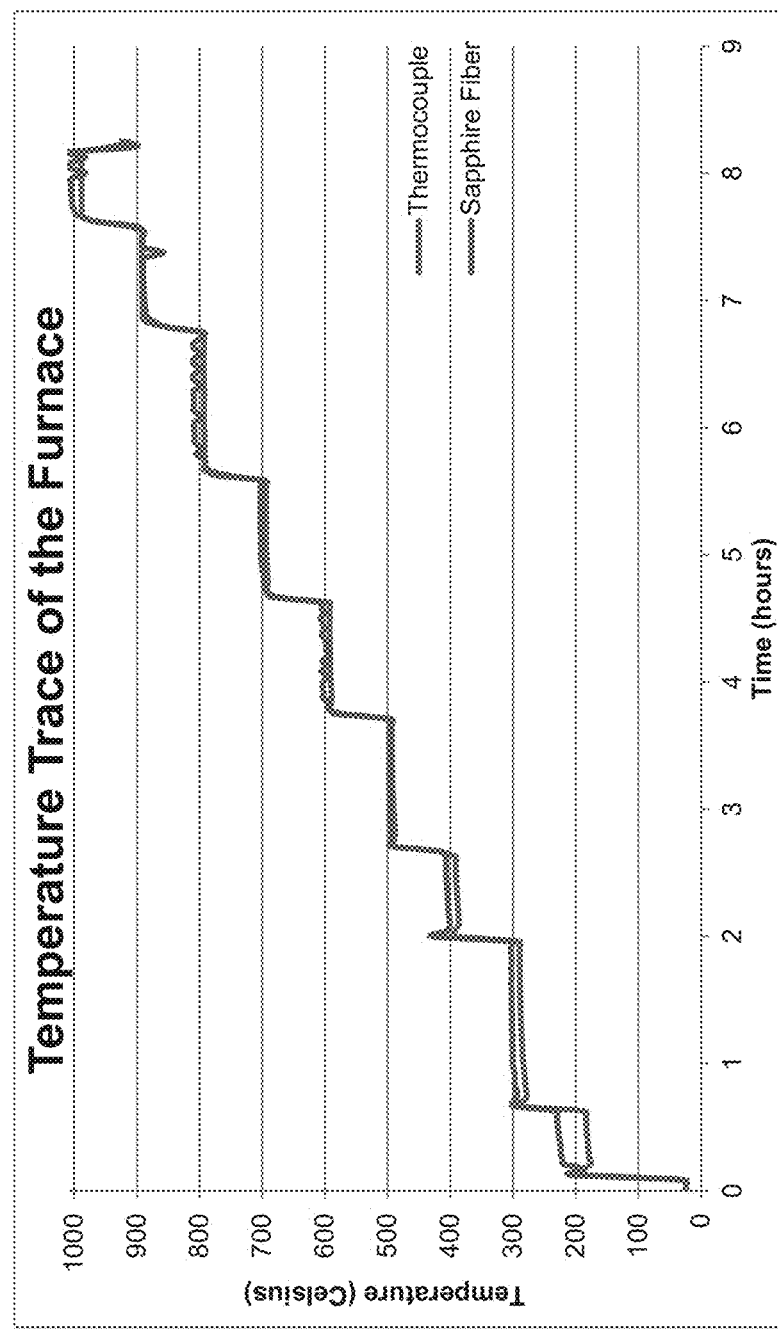
FIG. 14 is a graph depicting measurements of the air temperature inside of a tube furnace, as a function of time, recorded by a K-type thermocouple and a Bragg grating (Grating 3) inscribed in a cladded sapphire fiber according to an embodiment of the innovation.

In a heated trial of the sapphire fiber, a clad sapphire fiber with type-II FBGs was routed through the furnace as discussed above, and the temperature of the furnace was increased to 1000° C. in 100° C. increments. It is known that the sapphire fiber loses its ability to transmit light at temperatures above 1300° C., if it is not in an inert atmosphere. Because the fiber was not encapsulated in an inert atmosphere for this test, and because this test occurred in air that (prior to heating) was at normal atmospheric conditions, the upper temperature for the test was conservatively limited to 1000° C. The temperature of the furnace was held for one hour, for each new temperature, to determine if the OBR sensing would fail or if the gratings would degrade at that temperature. The OBR is sold with a factory calibration and software configuration that is appropriate for the expansion of silica fiber; and so, besides returning inaccurate values for the temperature, because the calibration is not appropriate for sapphire at high temperatures; the OBR measurement could fail entirely, because the sapphire fiber's expansion is so much larger than the expansion that is assumed in the software configuration of the OBR. A k-type thermocouple was placed near the fiber in the furnace, for comparison against the fiber measurements. The OBR and the thermocouple recorded temperature measurements every minute throughout the experiment. The temperature measurements, from the grating that was closest to the thermocouple that was in the furnace (Grating 3), are presented in FIG. 14 as a temperature-time trace.

The OBR is capable of measuring distributed temperatures along a fiber via the OFD reflectometry sensing technique, which returns the optical phase shift for segments of the fiber, along the length of the fiber. The response of the OBR was taken to be the optical phase shift. The experiment showed that the Bragg gratings produced steady values of the phase shift, along the length of the fiber, during the entire duration of the experiment, for each period where the temperature of the furnace was held constant. With this encouraging outcome, the data were analyzed for phase shift versus position. We determined a linear correlation, between the phase shift that was returned by the OBR, for each temperature step for the Bragg grating that was nearest to the thermocouple (Grating 3), and the temperature that was returned by the thermocouple. The temperature that is denoted in FIG. 14, as being from the sapphire fiber, is the temperature that was determined from Grating 3. It was determined by applying the correlation between phase shift and temperature that was determined by the method that is described above to the phase shift that was measured for Grating 3. It can be seen that although the correlation between phase shift and temperature was established using measurements that were made during the one hour long periods, when the temperature in the furnace was held constant, the temperatures that are determined from the phase shift data are reasonable for the periods when the furnace temperature is increasing, as well as for the periods when the furnace temperature is constant. In addition, the sapphire temperature measurements are relatively accurate compared to those of the thermocouple. The temperature measurements of Grating 3 differ from the thermocouple measurement in the low temperature range. This is likely due to the assumption of a linear relation between optical phase shift (which is proportional to differential expansion of the fiber) and fiber temperature, being poor for sapphire fiber. The relationship between the expansion coefficient for sapphire and temperature is not linear. Although the correlation between phase shift and fiber temperature is admittedly not perfect, it is sufficiently good for one to see from FIG. 14 that Grating 3 was able to produce temperature measurements, both during steady state and transient conditions, for temperatures up to at least as high as 1000° C.

Figure 15:
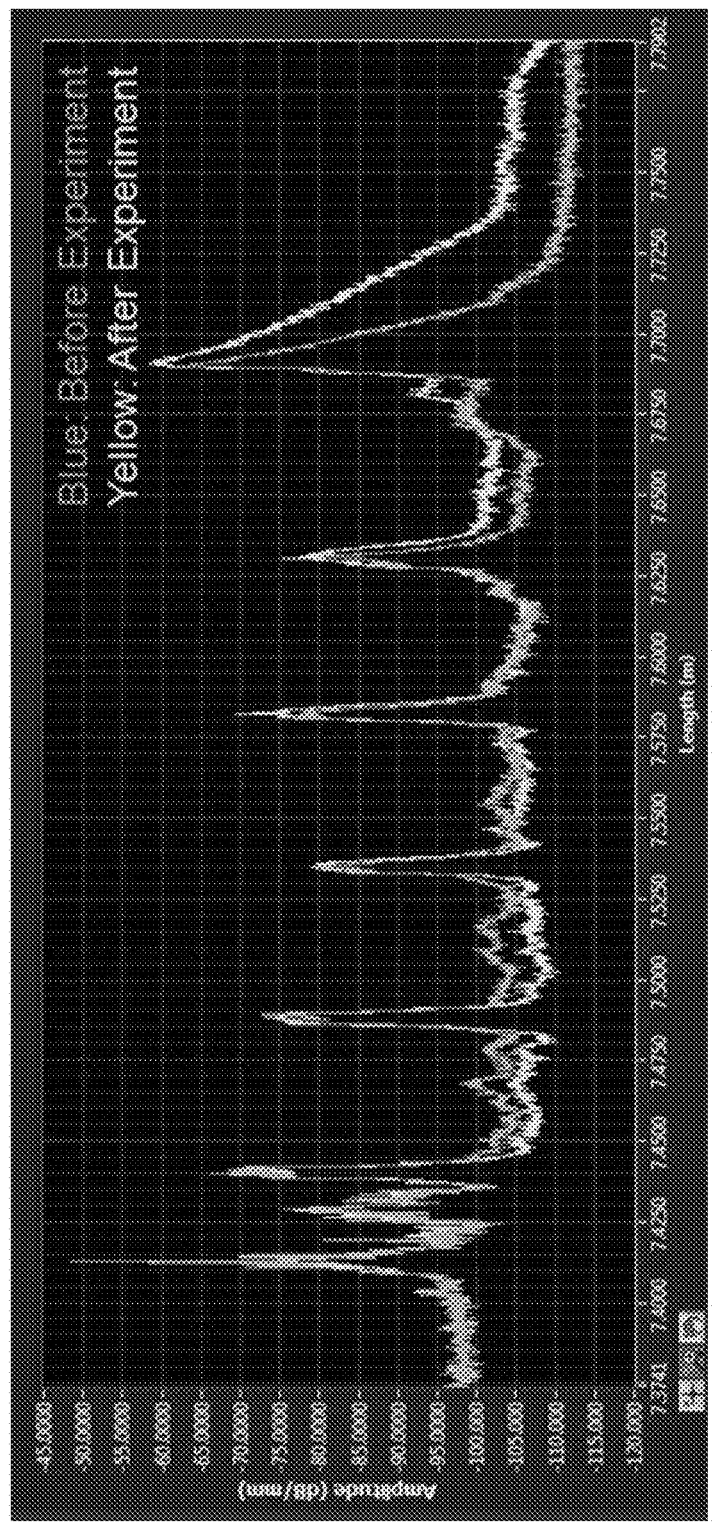
FIG. 15 is a screenshot from the OBR of the reflected amplitude of light reflected by the Bragg gratings in a cladded sapphire optical fiber according to an embodiment of the innovation, as a function of position along the fiber, before and after the high temperature experiment.

To ensure that the gratings had survived and had not degraded, the reflected amplitudes of the Bragg gratings were compared before and after the high temperature experiment. The reflected amplitudes of the gratings can be seen in FIG. 15. The gratings appear to have been largely unaffected by having been heated to high temperatures during the experiment. A few of the gratings even had a slightly higher reflected amplitude after the high temperature experiment than before it.

What has been described above includes examples of the innovation. It is, of course, not possible to describe every conceivable combination of components or methodologies for purposes of describing the subject innovation, but one of ordinary skill in the art may recognize that many further combinations and permutations of the innovation are possible. Accordingly, the innovation is intended to embrace all such alterations, modifications and variations that fall within the spirit and scope of the appended claims. Furthermore, to the extent that the term "includes" is used in either the detailed description or the claims, such term is intended to be inclusive in a manner similar to the term "comprising" as "comprising" is interpreted when employed as a transitional word in a claim.

What is claimed is:

1. A sapphire optical fiber having an azimuthally uniform internal refractive cladding within the sapphire optical fiber, wherein the sapphire optical fiber is a graded index sapphire optical fiber.

2. The sapphire optical fiber of claim 1 inscribed with at least one type-II Bragg grating.

3. The sapphire optical fiber of claim 1, wherein the sapphire optical fiber is part of a distributed temperature measurement system.

4. A sensor comprising the sapphire optical fiber of claim 1.

5. The sensor of claim 4, wherein the sensor measures temperature.

6. The sensor of claim 4, wherein the sensor measures strain.

7. The sensor of claim 4, wherein the sensor measures pressure.

8. The sensor of claim 4, wherein the sensor measures acceleration.

* * * * *

UNITED STATES PATENT AND TRADEMARK OFFICE
CERTIFICATE OF CORRECTION

PATENT NO.       : 10,436,978 B2
APPLICATION NO.  : 15/928411
DATED            : October 8, 2019
INVENTOR(S)      : Thomas Elder Blue and Brandon Augustus Wilson Page 1 of 1

It is certified that error appears in the above-identified patent and that said Letters Patent is hereby corrected as shown below:

In the Specification

Column 1, Line 13 add Government Support Clause "This invention was made with government support under grant number DE-NE0008305 awarded by the Department of Energy. The government has certain rights in the invention."

Signed and Sealed this
Thirteenth Day of October, 2020

Andrei Iancu
*Director of the United States Patent and Trademark Office*